United States Patent [19]

Sekizuka

[11] Patent Number: 5,368,648
[45] Date of Patent: Nov. 29, 1994

[54] SEALING APPARATUS

[75] Inventor: Hiroshi Sekizuka, Shiroyama, Japan

[73] Assignee: Tokyo Electron Sagami Kabushiki Kaisha, Kanagawa, Japan

[21] Appl. No.: 183,893

[22] Filed: Jan. 21, 1994

Related U.S. Application Data

[63] Continuation of Ser. No. 832,317, Feb. 7, 1992, abandoned.

[30] Foreign Application Priority Data

Feb. 26, 1991 [JP] Japan .................. 3-053099

[51] Int. Cl.$^5$ .................. C23C 16/00; F16J 15/08
[52] U.S. Cl. .................. 118/733; 277/3; 277/58; 277/235 R
[58] Field of Search .................. 277/3, 58, 59, 236, 277/235 R, 229; 118/733, 724

[56] References Cited

U.S. PATENT DOCUMENTS

| | | | |
|---|---|---|---|
| 2,726,882 | 12/1955 | Ryant, Jr. .................. | 277/58 |
| 3,116,932 | 1/1964 | Mallinckrodt .................. | 277/236 |
| 3,144,035 | 8/1964 | Hablanian et al. .................. | 277/3 |
| 3,328,039 | 6/1967 | McKeough .................. | 277/3 |
| 4,372,565 | 2/1983 | Lien .................. | 277/236 |
| 4,487,161 | 12/1984 | Hirata et al. .................. | 118/733 |
| 4,513,978 | 4/1985 | Nicholson .................. | 277/235 B |
| 4,561,662 | 12/1985 | de Villepoix et al. .................. | 277/236 |
| 4,641,603 | 2/1987 | Miyazaki et al. .................. | 118/733 |
| 4,726,689 | 7/1988 | Pollock .................. | 277/3 |
| 4,840,139 | 6/1989 | Takei .................. | 118/733 |
| 5,016,567 | 5/1991 | Iwabuchi et al. .................. | 118/733 |
| 5,133,561 | 7/1992 | Hattori et al. .................. | 277/3 |
| 5,133,986 | 7/1992 | Blum et al. .................. | 118/733 |

FOREIGN PATENT DOCUMENTS

| | | | |
|---|---|---|---|
| 2180168 | 8/1987 | Japan .................. | 277/3 |
| 0188135 | 11/1987 | Japan . | |
| 0123336 | 8/1989 | Japan . | |
| 1375942 | 12/1974 | United Kingdom .................. | 277/3 |

Primary Examiner—William A. Cuchlinski, Jr.
Assistant Examiner—Daniel G. DePumpo
Attorney, Agent, or Firm—Beveridge, DeGrandi, Weilacher & Young

[57] ABSTRACT

This invention relates to a sealing apparatus for use in heat treating apparatuses, ion injection apparatuses, etching apparatuses and other devices which require air sealing. Such devices may be used in semiconductor manufacturing. Mounting portions are formed in the sealing apparatus so as to separate an inner-side portion and an outer-side portion of a flange contact portion of a manifold and a process tube of a process container. Air is exhausted from the area between the inner-side portion and the outer-side portion of the flange contact portion of the manifold and the process tube. Two metal seal members are mounted to the mounting portions. These metal seal members have different surface processing thereon. The middle portion between the metal seal members is connected to an air exhaust source and air is exhausted to create a vacuum therein. This provides the sealing function to seal the process tube and the manifold.

22 Claims, 3 Drawing Sheets

SEALING APPARATUS

This application is a continuation of application Ser. No. 07/832,317, filed Feb. 7, 1992, now abandoned, which application is entirely incorporated herein by reference.

BACKGROUND TO THE INVENTION

The present invention relates to a sealing apparatus for containers where air is exhausted to a required depressurized (vacuum) status.

Generally, in heat-treating apparatuses, vacuum pumps are used to exhaust air to a required depressurized status. When this is done, a method commonly used in semiconductor manufacturing, for example, involves arranging O-rings comprising fluoride rubber or the like between the manifold and the process tubes for process containers, thereby maintaining air-tightness of the process container.

Not only this, Japanese Patent Application Laid Open No. 123336-1989, for example, proposes a sealing method wherein a furnace opening portion of a pressure-reduction CVD (chemical vapor deposition) apparatus has air-tightness maintained by an inner-side O-ring and an outer-side O-ring respectively provided to a contact portion of a seal cap for opening and closing the furnace opening and the furnace opening flange, and the contact portion of the furnace opening flange and the reaction tubes, then the space between the two O-rings is communicated with a vacuum opening.

Furthermore, Japanese Utility Model Application Laid Open No. 188135-1987, for example, proposes a sealing method which comprises two O-rings made of a material deteriorated by the furnace temperature and inserted through spacers into the gap between the glass reaction tubes and the door flange of the reaction furnace of a pressure-reduction CVD apparatus, thereby ensuring air-tightness. A rotary pump or the like is used to exhaust air from the space surrounded by the two O-rings and the glass tubes and the door flange via the spacers.

As has been described above, with the conventional sealing technologies, O-rings made from flexible fluoride rubber or some other material which deteriorates easily due to heat are used as the material of the sealing members of the seal portion of the process container. Thus, there are the following problems. More specifically, the heat resisting temperature of O-rings of this type is generally about 200° C. and so when the sealing portion of the heat-treating apparatus is heated to temperatures above this, the O-rings melt and deform so that there is the problem that it is not possible to obtain the required vacuum effect.

In addition, when the operation of the heat-treating apparatus is stopped and the O-rings used in the sealing portion thereof are exchanged, the O-rings are cooled and the O-rings themselves stick on other members of the sealing portion so that the removal of these O-rings becomes extremely difficult. Furthermore, in some cases, when the glass tubes or the like which comprise the members of the process container are removed from the container, there is the danger that these glass tubes may be damaged.

Not only this, the gas and water components included in the O-rings may be discharged during its use. The amount of this discharge changes according to the ambient pressure and temperature, and the processing time, and so when heat-treatment of the object being processed is performed by a process container using such O-rings as the sealing member, it requires much time to create a vacuum in the container after the pressure inside the process container has reached a required pressure. Then, if heat-treatment is not performed after the gas and water components from the O-rings have been sufficiently discharged, there is the problem that large differences may generate between processing lots of the objects being processed. In addition to this problem, there is also the problem that with reduction heat-treatment which uses a processing gas such as hydrogen ($H_2$) or the like to remove natural oxide films from the objects being processed, there is further discharge of the gas and water components from the O-ring even if there is already sufficient discharge from inside the process container by a vacuum pump, resulting in that the required reduction heat-treatment can still not be performed.

In the light of these problems associated with the conventional technology, the present invention has as an object the provision of a sealing apparatus for a process container that can perform sealing so that there is no mixing of unnecessary oxygen and components from the atmosphere and that can maintain a sufficient airtightness.

SUMMARY OF THE INVENTION

The present invention relates to a sealing apparatus that is a sealing apparatus that seals a flange contact portion of a process container where air is exhausted to a required vacuum status, and which includes metal sealing members which have undergone respectively different surface processings, fitted respectively to mounting grooves respectively provided so as to separate into outer-side and inner-side portions in the direction of the diameter of a flange contact portion, and with a vacuum being formed in a middle portion of a mounting portion of both of the metal sealing members.

The middle portion of both of the metal sealing members of the sealing apparatus of the present invention has air exhausted to a vacuum so that this middle space becomes a vacuum status and so the sealing effect of the metal sealing members is further heightened, there is no mixing of air or the like from the atmosphere to inside the process tube of the process container, and there is a more definite sealing function.

DETAILED DESCRIPTION OF THE PREFERRED EMBODIMENTS

The following is a description of an embodiment of the sealing apparatus of the present invention, applied to the flange portion of a glass process tube of a vertical type of heat-treating apparatus which requires sealing conditions of low driving and high performance, with reference to the appended drawings.

Figure 1:
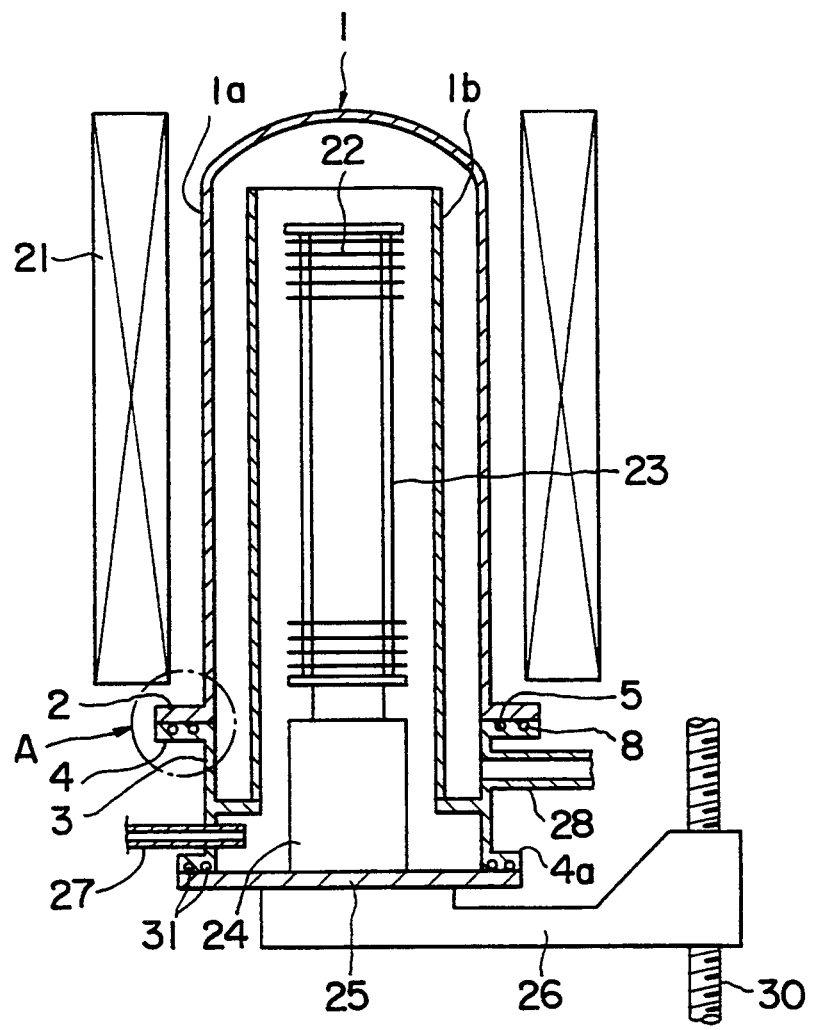
FIG. 1 is a vertical sectional view of a vertical type of heat-treating apparatus to which an embodiment of the sealing apparatus of the present invention is applied.

FIG. 1 is a vertical sectional view of a vertical type of heat-treating apparatus to which an embodiment of the sealing apparatus of the present invention has been applied. In FIG. 1, a vertical type process tube 1 of a process container of a vertical type of heat-treating apparatus is comprised of a heat resistant material such as quartz glass for example, and the process tubes 1 consist of an outer-side process tube 1a and an inner-side process tube 1b. To the lower end of the inner-side process tube 1b is formed a flange portion 2 and air-tightness is maintained by metal sealing members, for example O-rings, 5, 8 fixed so as to oppose and contact a flange portion 4 of an upper portion of a manifold 3 of SUS or some other metal and provided to a lower portion of the process tube 1 and the flange portion 2, and thus seal and configure a process container. In this case, the sectional shape of the sealing members is normally circular, but can be hollow, flat or wave-shaped.

Inside the process tube 1 many semiconductor wafers 22, for example, are horizontally stored and housed on the glass wafer board 23, as the processing object of the heat-treatment. Furthermore, this glass wafer board 23 is placed on a loading platform 24 and this loading platform 24 is placed on a lid unit 25. This lid unit 25 is such that it can move up and down by the raising and lowering mechanism 26 that engages with a ball screw 30. By this arrangement, it is possible to carry the semiconductor wafers to and from a required position inside the process tube 1. FIG. 1 shows the case where the lid unit 25 has been moved to the upper position by the raising and lowering mechanism 26, where the wafer 22 is carried to inside the process tube 1, and where sealing is performed by a normal sealing member 31 provided to inside the mounting groove of the flange portion 4a, which is in air-tight contact with the flange portion 4a provided to the lower end of the manifold 3. Moreover, the reason why a normal sealing member can be used for sealing between the lid unit 25 and the flange portion 4a provided to the lower end of the manifold 3 is because of the lower temperature level (such as 150° C. or less) of this region when compared to that of the other portions.

In addition, the process tube 1 or the manifold 3 is connected to a introduction tube 27 and an air exhaust tube 28 for the process gas, and the introduction tube 27 is connected to the process gas source via a plastic tube (not shown), and the air exhaust tube 28 is connected to a vacuum pump (not shown) via a tube connector or the like. Furthermore, a heater 21 is provided around the process tube 1. This heater 21 is a low-resistance heater and is cylindrical in shape, and is comprised of at least three heating zones, and enables the suitable setting of the temperature within a range of from 500° C. to 1200° C. for example.

Figure 2:
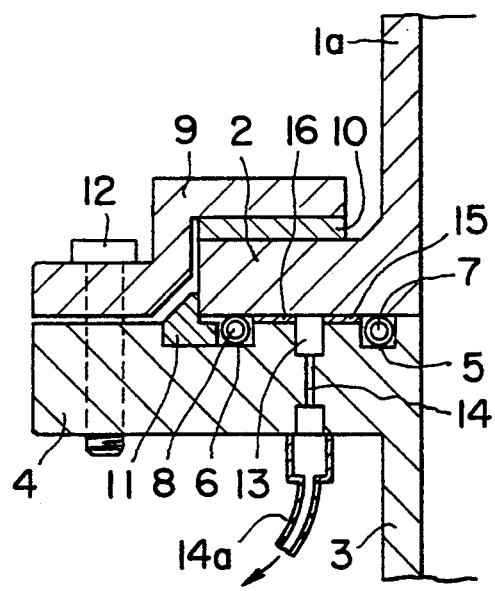
FIG. 2 is an enlarged partial sectional view of a first embodiment of the sealing apparatus of the present invention, indicated by the arrow A of FIG. 1.

In addition, FIG. 2 is an enlarged partial sectional view of a first embodiment of the sealing apparatus of the present invention, indicated by the arrow A of FIG. 1. With this embodiment of the sealing apparatus, concentric mounting grooves 5, 6 of different diameters are formed on the upper surface of the flange portion 4 formed from the manifold 3 made from the metal (such as SUS) to the outer direction. Then, inside the mounting groove 5 formed on the side closest to the inner portion of the outer-side process tube 1a of the process tube 1 is mounted a metal sealing member 7 which has a high temperature resistance and a thin sectional thickness.

The outer surface of the metal sealing member 7 is processed by nickel plating or the like to improve the sealing characteristics and corrosion resistance. Also, a spacer 11 of Teflon (polytetrafluoroethylene fiber) for example, is used to mount a metal sealing member 8 coated with an elastomer material such as PTFE or the like thereon, to the mounting groove 6 formed concentric to the mounting groove 5 and positioned to the outer side thereof. Moreover, these mounting grooves 5, 6 can be formed on the lower surface of the flange 2 of the outer-side process tube 1a, and metal sealing members 7, 8 that have respectively undergone different surface processing can be mounted to the mounting grooves 5, 6 and under the same conditions as described above.

Furthermore, to the substantially center position of the mounting grooves 5, 6 mounting the metal sealing members 7, 8 is formed an air exhaust groove 13 and an exhaust tube 14a is connected to the vacuum pump (not shown) The exhaust tube 14a exhausts the groove 13 via an exhaust hole 14.

Then, a heat resistant spacer 11 is engaged with the side of the outer periphery of the mounting groove 6 and brought into contact with the outer periphery of the flange 2 and centering performed, and a heat-resistant spacer 10 is placed on the upper surface of the flange portion 2 and a suitable means such as a bolt 12 or the like is used to tighten and fix the flange portion 4 of the manifold 3 and the flange portion 2 of the outer-side process tube 1a by a pressing fitting 9 which is L-shape in section. When this is done, the pressing fitting 9 is tightened to the degree that the flange portions 2, 4 can withstand the strength. In addition, retainers 15, 16 of Teflon (polytetrafluoroethylene fiber), for example, are inserted into the contact surface of the flange portions 2, 4 so that this limit for the tightening strength can be maintained. In addition, the heat-resistant spacer 10 uses a metal jacket gasket which is wave-shaped or flat in section and which has a glass center converted by a thin metal film.

Figure 3:
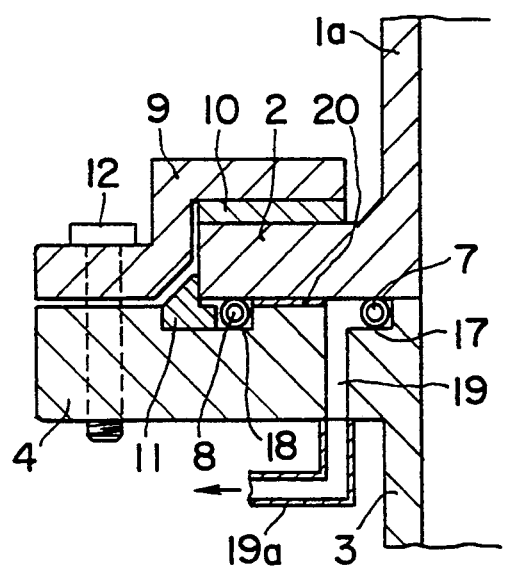
FIG. 3 is an enlarged partial sectional view of a second embodiment of the sealing apparatus of the present invention.

FIG. 3 is an enlarged partial sectional view of a second embodiment of the sealing apparatus of the present invention. In this embodiment, a mounting step portion 17 and a mounting groove 18 are concentrically formed on the upper surface of the flange portion 4 of the manifold 3, and to the mounting step portion 17 formed in the vicinity of the inner side of the outer-side process tube 1a is mounted a metal sealing member which has nickel plating or the like of a thin sectional thickness implemented to its outer peripheral surface to improve the sealing characteristic and thus to prevent corrosion. Then, to inside the mounting groove 18 formed outwards from the mounting step portion 17 is mounted a metal sealing member 8 which has been coated with an elastomer material, and an air exhaust hole 19 is formed in the flange portion 4 so as to communicate with the mounting step portion 17 formed on the upper surface of the flange portion 4 of the manifold 3, and vacuum exhaust is performed by a vacuum pump (not shown) which communicates with the air exhaust hole 19 via an exhaust tube 19a. Then, between the contact surface of the lower surface of the flange portion 3 and the upper surface of the flange portion 4 is provided a retainer 20. Then, a suitable means such as a bolt 12 or the like and a pressing fitting 9 which is L-shaped in section and placed on the upper surface of the flange portion 2 of the outer-side process tube 1a is used to center and tighten the heat-resistant spacer 11.

Figure 4:
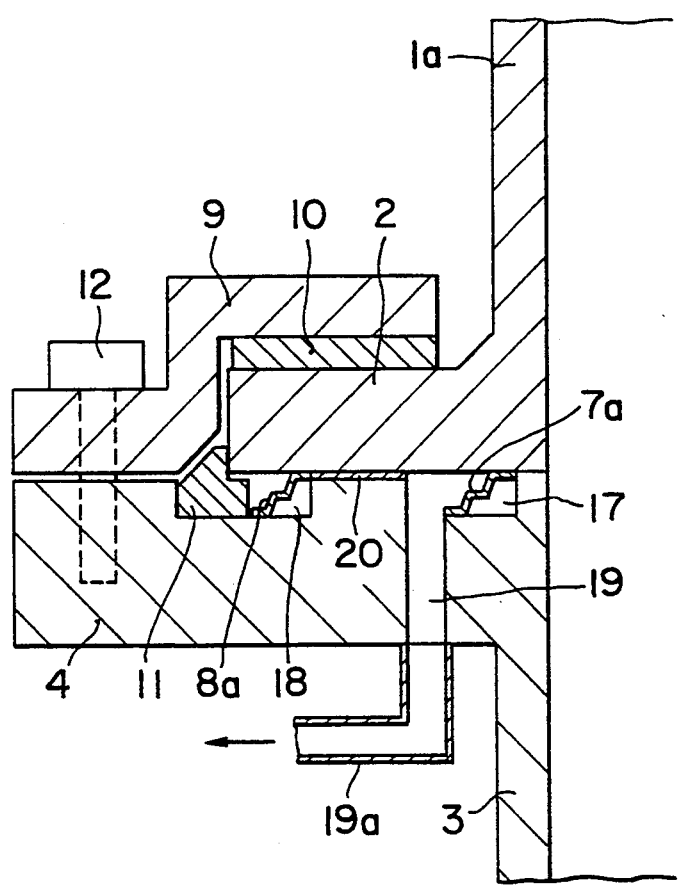
FIG. 4 is an enlarged partial sectional view of a third embodiment of the sealing apparatus of the present invention.

FIG. 4 is an enlarged partial sectional view of a third embodiment of the sealing apparatus of the present invention. In this embodiment, wave-shaped metal gaskets 7a, 8a are used instead of the metal sealing members 7, 8 shown in FIG. 3. The other portions of the features of the embodiment are the same as those indicated for the second embodiment and therefore, the description of these portions will be omitted here.

The following is a description of the operation of embodiments of the sealing apparatus of the present invention. First, the temperature of the heater 21 for the equal-temperature region inside the process tube is set to a temperature of 1000° C. for example. Then, as shown in FIG. 1, the ball screw 30 is rotationally driven and the raising and lowering mechanism 26 is moved in the upwards direction, and the lower surface of the flange portion 4a of the lower end of the manifold 3 and the upper surface of the lid unit 25 are brought into contact and made the sealed status. Then, as shown in FIG. 2, when there is this contact status and the air is exhausted from the air exhaust groove 13 using the vacuum pump, the space between the metal sealing members 7, 8 become the vacuum status. As the result, the sealing effect is heightened without materially deteriorating of the metal sealing members 7, 8 and there is a definite sealing function without the mixing of atmospheric air or the like to inside the process tube 1.

In particular, with the sealing apparatus of the present invention, there is no discharge of water or gas components from the sealing portion since a metal sealing member with a high thermal resistance is used on the side closest to the inner periphery of the process tube 1a on the outer side and therefore contamination due to these components is prevented. Also, a flexible sealing portion that has a different surface treatment implemented to it is provided on the outer side of this sealing member and so it is possible to maintain an extremely high sealing effect.

Also, the temperature of the metal sealing member 8 on the outer periphery becomes lower than the temperature of the metal sealing member 8 on the inner periphery, and so sealing members such as O-rings of an elastomer such as normal fluorine rubber or the like can be used.

In addition, the sealing apparatus of the present invention can be applied not only to press-reduction CVD apparatus for which a high sealing performance is required, but is also applicable to heat-treating apparatuses such as dispersion furnaces and normal-pressure heat-treating apparatuses and the like, and is not limited in application to a vertical type heat-treating apparatus as it can also be applied to a horizontal type apparatus thereof. Furthermore, the present invention is not limited to heat-treating apparatuses as application is also possible to ion injection apparatuses, etching apparatuses and other apparatuses which require a highly air-tightened sealing apparatus.

What is claimed is:

1. A heat-treatment apparatus comprising:
a first contacting portion formed on a flange of a process tube for containing objects to be processed, and a second contacting portion formed on a flange of a manifold, whereby said first and said second contacting portions define an inner-side mounting portion and an outer-side mounting portion which are separate from one another in a radial direction of said first and said second contacting portions;
a first retainer and a second retainer inserted between said first contacting portion formed on the flange of the process tube and said second contacting portion formed on the flange of the manifold, said first and said second retainers limiting tightening between the flange portions of the process tube and the manifold;
a first metal seal means and a second metal seal means mounted in said inner-side mounting portion and said outer-side mounting portion respectively, wherein said surface of said first metal seal means in said inner-side mounting portion includes processed nickel plating to improve the sealing characteristics and corrosion resistance, and said surface of said second metal seal means in said outer-side mounting portion includes a metal seal coated with a thin elastomer film thereon; and
an exhaust seal means for vacuum exhausting a middle portion between said first and said second metal seal means, whereby exhausting is carried out to bring said middle portion to a predetermined vacuum state.

2. The heat-treatment apparatus according to claim 1, wherein said inner-side mounting portion and said outer-side mounting portion are annular mounting grooves.

3. The heat-treatment apparatus according to claim 1, wherein said inner-side mounting portion is a mounting step portion.

4. The heat-treatment apparatus according to claim 1, wherein at least one of said first metal seal means and said second metal seal means is an O-ring.

5. The heat-treatment apparatus according to claim 1, wherein at least one of said first metal seal means and said second metal seal means is a metal gasket having a wave shape in section.

6. The heat-treatment apparatus according to claim 1, wherein an air exhaust groove is defined in said middle portion, and said air exhaust groove is connected to an air exhaust hole.

7. The heat-treatment apparatus according to claim 1, wherein a heat resistant spacer is placed on an upper surface of said flange of the process tube and fixed thereon by a pressing fitting.

8. The heat-treatment apparatus according to claim 1, wherein said process tube is made of quartz.

9. The heat-treatment apparatus according to claim 1, wherein said manifold is made of stainless steel.

10. The heat-treatment apparatus according to claim 2, wherein a heat resistant spacer is engaged with an outer periphery of said annular mounting groove of said outer-side mounting portion, whereby said spacer is brought into contact with an outer periphery of said flange of said process tube for centering the process tube.

11. The heat-treatment apparatus according to claim 1, further including:
a heat resistant spacer engaged with a side of the outer periphery of a mounting groove defined in the flange of the manifold, said heat resistant spacer being brought into contact with the outer periphery of the flange of the process tube so as to center the process tube.

12. A heat-treating apparatus comprising:
a process tube for containing objects to be processed;
a manifold provided adjacent a lower portion of said process tube;

a seal cover sealing a lower opening of said manifold;

a first contacting portion formed on a flange of the process tube, and a second contacting portion formed on a flange of the manifold, whereby said first and said second contacting portions define an inner-side mounting portion and an outer-side mounting portion, which are separate from one another in a radial direction of said first and said second contacting portions;

a first retainer and a second retainer inserted between said first contacting portion formed on the flange of the process tube and said second contacting portion formed on the flange of the manifold, said first and said second retainers limiting tightening between the flange portions of the process tube and the manifold;

a first metal seal means and a second metal seal means mounted in said inner-side mounting portion and said outer-side mounting portion respectively, wherein said surface of said first metal seal means in said inner-side mounting portion includes processed nickel plating to improve the sealing characteristics and corrosion resistance, and said surface of said second metal seal means in said outer-side mounting portion includes a metal seal coated with a thin elastomer film thereon; and an exhaust seal means for vacuum exhausting a middle portion between said first and said second metal seal means, whereby exhausting is carried out to bring said middle portion to a predetermined vacuum state.

13. The heat-treatment apparatus according to claim 12, wherein said inner-side mounting portion and said outer-side mounting portion are annular mounting grooves.

14. The heat-treatment apparatus according to claim 12, wherein said inner-side mounting portion is a mounting step portion.

15. The heat-treatment apparatus according to claim 12, wherein at least one of said first metal seal means and said second metal seal means is an O-ring.

16. The heat-treatment apparatus according to claim 12, wherein at least one of said first metal seal means and said second metal seal means is a metal gasket having a wave shape in section.

17. The heat-treatment apparatus according to claim 12, wherein an air exhaust groove is defined in said middle portion, and said air exhaust groove is connected to an air exhaust hole.

18. The heat-treatment apparatus according to claim 12, wherein a heat resistant spacer is placed on an upper surface of said flange of said process tube and fixed thereon by a pressing fitting.

19. The heat-treatment apparatus according to claim 12, wherein said process tube is made of quartz.

20. The heat-treatment apparatus according to claim 12, wherein said manifold is made of stainless steel.

21. The heat-treatment apparatus according to claim 13, wherein a heat resistant spacer is engaged with an outer periphery of said annular mounting groove of said outer-side mounting portion, whereby said spacer is brought into contact with an outer periphery of said flange of said process tube for centering the process tube.

22. The heat-treating apparatus according to claim 12, further including:

a heat resistant spacer engaged with a side of the outer periphery of a mounting groove defined in the flange of the manifold, said heat resistant spacer being brought into contact with the outer periphery of the flange of the process tube so as to center the process tube.

* * * * *